NEGATIVE RESISTANCE TRANSISTOR

Filed May 22, 1959

INVENTOR.
ROBERT N. NOYCE
BY
Lippincott & Ralls
ATTORNEYS

United States Patent Office 3,015,048
Patented Dec. 26, 1961

3,015,048
NEGATIVE RESISTANCE TRANSISTOR

Robert N. Noyce, Los Altos, Calif., assignor, by mesne assignments, to Fairchild Camera and Instrument Corporation, Long Island City, N.Y., a corporation of Delaware Filed May 22, 1959, Ser. No. 815,089
7 Claims. (Cl. 317—234)

The present invention relates to an improved transistor particularly adapted for very high frequency applications and having negative resistance characteristics.

Limitations in the high frequency applicability of transistors have been encountered in the art as a result of the requirements that very small sizes are required in solid semiconductors in order to limit the time delay and spreading resistances associated with conduction therethrough. While this size limitation has in the past proven difficult to overcome, modern manufacturing techniques in the transistor field have enabled the production of transistors having base elements with very small dimensions, i.e., a width of about one hundred microns and a thickness of one micron, to thereby achieve the relatively short time delays or transit times and spreading resistances necessary for high frequency operation. Although these manufacturing advancements have materially extended the frequency range of transistors, there yet remains the difficulty of applying electrical contacts to transistors having portions of such minute size as noted above. This difficulty is magnified by the necessity of forming separate contacts to small transistor portions in order to minimize the transistor resistance including the spreading resistance thereof. While numerous advancements have been made in this respect, there yet remains certain frequency limitation in the transistor art which limits the use of transistors in extremely high frequency applications. The present invention provides a transistor operable in a frequency range well beyond that normally available in the transistor art.

Relatively wide applicability is found in the electronic arts for circuits or devices exhibiting negative resistance characteristics, as, for example, in oscillator circuits. As regards the applicability of transistors to this field, there have been developed both point contact transistors and hook-collector transistors exhibiting negative resistance characteristics. However, certain disadvantages are inherent in these types of transistors, particularly as regards their applicability to handle extremely high-frequency signals. In this respect there have been developed avalanche transistors, which also have negative resistance characteristics. Avalanche transistors are known to switch very rapidly; however, they require a relatively long time to recover as excess carriers introduced into the base must flow out through the relatively high base resistance before the transistor returns to its high impedance state.

The present invention provides a transistor which is operable in very high frequency ranges, as, for example, of the order of 1,000 megacycles. The transistor hereof has a very minute size, so as to thereby attain very short transit time and low resistance, and furthermore, the present invention entirely overcomes the problem attendant attachment of separate ohmic contacts to the transistor elements. It is herein contemplated that there shall be provided a transistor having the physical configuration of a triode or three-element device, which is however, provided with electrical contacts establishing same as a diode circuit element. In this manner, the above-noted problems of attaching contacts to the minute portions of the transistor are overcome and at the same time there is attained a very rapidly varying negative resistance characteristic.

Although the present invention is adapted for various types of transistors, it has been found that double-diffused silicon transistors are particularly well suited to the present invention.

It is an object of the present invention to provide a transistor structure having a very high cutoff frequency in the megacycle range.

It is another object of the present invention to provide transistor structure having a negative resistance characteristic with a very high frequency operating range.

It is a further object of the present invention to provide transistor structure overcoming prior problems of connecting contacts to extremely minute transistor elements whereby very high frequency transistor operation is possible.

It is yet another object of the present invention to provide a transistor having a very rapidly varying negative resistance characteristic with a large voltage variation therein.

Various other objects and possible advantages of the present invention will become apparent to those skilled in the art from the following description and accompanying drawings, however, such description is not to be taken as limiting, and reference is made to the accompanying claims for a precise delineation of the true scope of the present invention.

The invention is illustrated in the accompanying drawings wherein.

Figure 1:
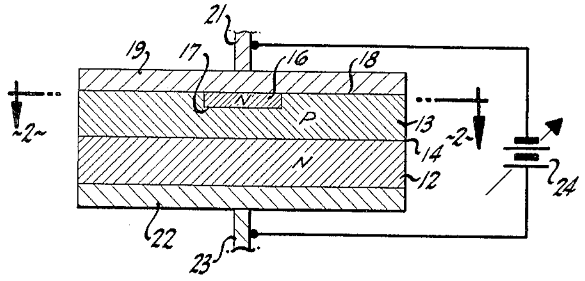
FIG. 1 is a cross-sectional view of a transistor structure in accordance with the present invention, magnified many times for clarity and including an electrical bias circuit illustrative of the manner of operating the transistor.
Figure 2:
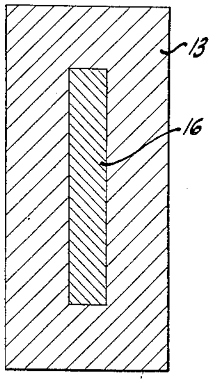
FIG. 2 is a sectional view taken in the plane 2—2 of FIG. 1.

Considering now an illustrative example of the present invention as shown in FIG. 1 of the drawing, there will be seen to be provided a transistor formed in accordance with the present invention and including a wafer or disc 12, which is herein considered to be comprised of an N-type semiconducting material. Upon this wafer 12, which forms the collector element of the transistor 11, there is disposed a layer 13 of P-type semiconducting material and comprising the base member of the transistor. The layer 13 is formed in a conventional manner as by diffusion of a P-type inpurity into the N-type wafer 12, to form a collector junction 14 between the collector and base. Atop the base layer 13 there is provided a minute emitter dot 16, which may be formed by diffusing an N-type impurity into the base layer. It will be seen that in addition to the establishment of an emitter junction 17 between the base 13 and emitter 16, there is provided a substantially common upper surface 18 extending across the top of the transistor and including both base and emitter portions thereof.

Upon this upper surface 18 there is provided an ohmic contact 19 formed of a material which is a good electrical conductor and which is preferably bonded or alloyed to the material of the transistor to form an ohmic contact therewith. This contact 19 is common to both the emitter and base and must make ohmic contact with the N-type emitter 16 as well as with the P-type base 13. In the case of an NPN silicon transistor, herein illustrated, a suitable contact is achieved by a thin evaporated layer of aluminum which is alloyed to the silicon at a temperature only slightly in excess of the silicon-aluminum eutectic temperature of 585° C. For a PNP transistor structure, which is equally adapted to the present invention, suitable contact may be attained with a thin evaporated layer of silver similarly alloyed at about 780° C. A lead 21, formed of a suitable electrical conductor, is affixed to the contact 19 in extension therefrom to provide means by which this portion of the transistor may be electrically connected in a circuit. Beneath the collector region 12 there is provided a second ohmic contact 22, preferably formed as a layer substantially covering the under surface of the collector, and a lead 23 formed of electrically conducting wire is affixed to this contact to provide the other means for joining the transistor to an electrical circuit. This collector contact 22 may, for example, comprise a gold-1% antimony layer alloyed into the silicon at 450° C. in the case of an NPN transistor, or in the case of a PNP structure, the contact may be formed of a thin aluminum layer alloyed into the silicon at a temperaature of about 800° C.

It will be appreciated that the transistor illustrated in FIG. 1 of the drawings is materially magnified over that which would in actual practice be manufactured. Thus, for example, the emitter 16 may have a width of the order of ten microns and the thickness of the base layer 13 between the emitter 16 and collector 12 may have a dimension of the order of one micron. Conventional transistor practice requires the connection of electrical leads to the emitter 16 and to the base 13. However, in order to minimize the spreading resistance associated with these elements, it is necessary for the electrical connection to cover substantially all of the exposed surface of these elements. It will be appreciated that with a transistor having the dimensions of the order noted above, such manufacturing tolerances are very difficult to attain. Unfortunately, failure to attain same materially affects the high frequency response of the transistor as the increased resistance introduced therein by same thereby increases base and emitter spreading resistances and consequently the overall transit time. In the present invention the difficulty of separately connecting electrical leads to substantially all of the exposed surface of the minute emitter 16 as well as to the exposed surface of the base member 13 is entirely precluded, for as herein illustrated the ohmic contact 19 directly engages in electrical contact the entire exposed common surface 18, including both base and emitter. In this manner then smaller structures are possible and the high frequency response of the described transistor is materially improved over that available with other conventional transistors.

Considering now the operation of the transistor 11 described above, it will be seen that by the connection of a variable power supply 24 between the ohmic contact leads 21 and 23 there is impressed a potential across the transistor with the collector 12 thereof being maintained at a relatively positive potential with respect to both the base and emitter. With this connection there is produced a small reverse current flow which may be explained as being carried generally by holes migrating from the collector into the base member by virtue of avalanche. These holes may be considered to flow directly through the base member to the upper ohmic contact 19 from the collector 12 so that there is then established a complete high-resistance circuit through the transistor entirely omitting the emitter portion of the transistor. As the applied voltage is increased, as may be accomplished in any suitable manner and as is illustrated by the arrow through the battery 24, the holes injected into the base from the collector will create a voltage drop in the layer of the base under the emitter between same and the collector. This potential is proportional to the current (I) times the resistance (R) of the circuit through the base layer and may therefore be termed the IR drop. At sufficient voltages, this IR drop established across the base layer between emitter and collector will be sufficient to provide a forward biasing of the emitter, whereby same therefore conducts into the base to the collector. Electrons emitted from the emitter 16 cross through the base and cause by avalanche more holes to flow from the collector into the base region, and it has been found that this condition continues at lower voltages once the phenomenon has been initiated. Consequently, it will be seen that there is produced a negative current-voltage relationship at a particular point of operation of the transistor.

Figure 3:
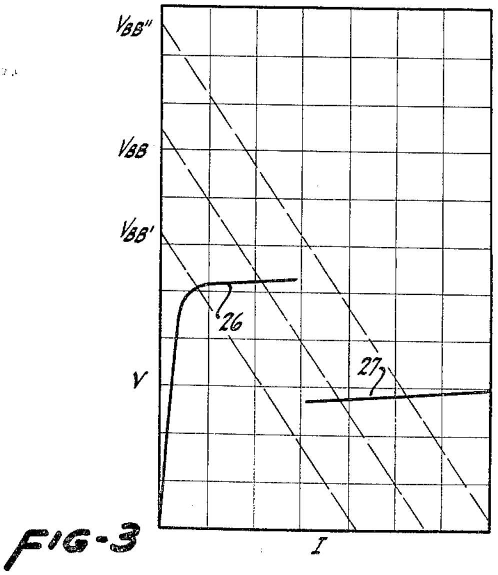
FIG. 3 is a plot of the current-voltage relationship of the transistor of FIG. 1 as observed on a cathode-ray oscilloscope screen.

In this respect, reference is made to FIG. 3 of the drawing, wherein there is illustrated a plot of voltage (V) versus current (I) for the transistor. It may be seen from FIG. 3 that an increased voltage across the transistor, as applied by the battery 24, will produce a relatively linear increase in current through the transistor in the reverse direction up to a particular voltage value. At this voltage value, the current increases rapidly for a relatively small increase in applied voltage, as would be expected in an avalanche transistor. However, contrary to avalanche transistors of the type described in "Transistor Technology" volume II, chapter 6 (Van Nostrum), and as may be considered conventional, the present invention after some relatively nominal increase in current and voltage reaches a point wherein the emitter is sufficiently forwardly biased to conduct a large current and to thereby produce by avalanche a large plurality of electron-hole pairs which consequently materially increase the current without further voltage increase. Again, contrary to more conventional avalanche transistors as described in the above-noted publication, there is produced a substantially discontinuous portion in the voltage-current relationship of the transistor, for at the point where substantial emitter conduction occurs the voltage drop across the transistor is materially reduced, and furthermore same occurs almost instantaneously. Rather than providing a gently sloping negative resistance curve of voltage versus current, as is conventional, the present invention provides a substantially abrupt departure from an avalanche transistor curve which is similar in part to the curve 26 at the left of FIG. 3. In this invention the negative resistance characteristic is quite abrupt and the voltage necessary to maintain the same current flow is reduced substantially in half. A further increase in voltage following forward conduction of the transistor from the emitter to the collector will produce a gradually increasing current, as is depicted by the curve 27 at the right of FIG. 3. Consequently, the transistor of FIG. 1, as contemplated by the present invention, provides a very rapid and abrupt variation in the voltage-current relationship across the transistor.

The plot of FIG. 3 is that obtainable from the screen of a cathode-ray oscilloscope and it will be appreciated that while the left-hand portion 26 of the curve shown must of necessity be connected in some manner to the right-hand portion 27, the time of variation between the two curves is too rapid to be measured by conventional oscilloscope means. It may thus be assumed for convenience that the left-hand portion of the curve is in fact connected by a substantially vertical line to the right-hand portion, whereby the voltage across the transistor may be considered to substantially instantaneously drop to about one-half of its value while at the same time maintaining the same current flow through the transistor. Although the voltage-current relationship plotted in FIG. 3 of the drawing shows the voltage drop from maximum to that required to maintain current flow through the transistor as being substantially 50 percent of the maximum voltage, yet it is possible to materially improved this figure with the configuration illustrated in FIG. 1, for the plot of FIG. 3 was actually obtained from a conventional transistor not specifically manufactured or designed in accordance with the present invention, but instead modified to illustrate the results attainable therewith.

In the preferred embodiment of this invention, an NPN silicon structure is employed. It has been found that this structure gives the largest ratio between the voltage across the transistor when relatively high currents (26) are flowing through it, and the voltage at which appreciable current begins to flow (27). Furthermore, if the voltages at which avalanche is initiated are relatively low, which may be accomplished by using a relatively high conductivity collector body 12, and a relatively abrupt junction 14, this ratio is further increased. For example, if avalanche is initiated (26) at 25 volts, the final voltage (27) is approximately 8 volts, a ratio of more than 3:1. In other structures, the same discontinuous voltage drop occurs, but to a lesser extent.

As regards the avalanche conducting phenomenon noted above, no detailed discussion is herein included inasmuch as avalanche transistors are known in the art, however it is to be noted in brief that avalanche occurs from minority carriers which are thermally or otherwise generated and diffused into high field regions of a reverse bias junction wherein they are accelerated to produce hole-electron pairs by collision with atoms of the crystal lattice therein. The present invention has numerous advantages not to be found in conventional avalanche transistors as, for example, the current-voltage characteristics illustrated in FIG. 3. However, insofar as basic conduction theory is concerned, reference is made to the literature for a more complete dissertation of avalanche conduction. It is particularly noted at this point that although the transistor illustrated in FIG. 1 of the drawing is shown to be a junction transistor of the N-P-N type, yet the invention is equally applicable with a junction transistor of the P-N-P type with suitable modification of the applied potential polarity. Furthermore, it is possible, in accordance with the present invention, to electrically connect other components of a triode transistor rather than those connected in the illustrated embodiment of the invention. Thus, for example, it may in certain instances be desirable to provide a common ohmic contact between the collector and base of the transistor with the other contact extending from the transistor emitter. While the choice of shorted transistor elements depends in good part upon the type of transistor and mode of manufacture thereof, it has been found that for double-diffused transistors of the type shown, the illustrated embodiment is preferable inasmuch as the emitter and base portions of the transistor are contiguous, and separated only by the emitter junction which is quite difficult to maintain electrically unshorted during the manufacturing process wherein it is desired to substantially cover the exposed transistor portions with an electrically conducting material providing an ohmic contact therewith.

Figure 4:
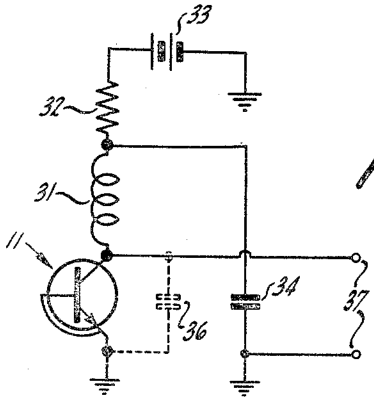
FIG. 4 is a circuit diagram illustrating one application of the transistor of this invention.

There is illustrated in FIG. 4 of the drawings one possible circuit in which the present invention is applicable and the transistor is shown at 11 thereof. The illustrated circuit is a relatively simple oscillator and in connection therewith it is noted that all oscillators may be properly considered to be negative resistance oscillators in that oscillation can only be maintained through the return to the input of a certain portion of the output thereof. Although most conventional oscillators employ an external feedback circuit to maintain oscillaion, the device of the present invention is particularly well adapted to the provision of an internal feedback, inasmuch as there is exhibited by the transistor a negative resistance characteristic. As shown in FIG. 4 of the drawing, the transistor 11 is arranged with the common emitter and base connected to ground, and the collector of the transistor connected through an inductance 31 and a series resistance 32 to the positive terminal of a grounded power supply or battery 33. Frequency discrimination is provided by the inductance 31 and a capacitor 34 connected between ground and the end of the inductance 31 closest to the power supply, and there will be seen to be included in this circuit a further capacitance 36 composed of the shunt capacitance inherent between the emitter and collector of the transistor 11 and thus illustrated in dotted lines in FIG. 4. An output pulse from the oscillator may be obtained from the collector terminal of the transistor and thus output terminals 37 are shown connected with one to ground and the other to the transistor-collector so as to be thereby in effect connected across the transistor. Although oscillator circuits employing point-contact transistors are well known, it is apparent that the circuit of FIG. 4, employing the negative resistance junction transistor of the present invention is highly advantageous over these prior art circuits for the elimination of point contact transistor limitations is thereby attained. Inasmuch as the operation of oscillator circuits are well known in the art, no detailed discussion of FIG. 4 is herein included, but instead reference is made to the open literature, as for example, to the publication "Transistor Electronics," by Lo, Endres, Zawels, Waldhauer and Cheng, and published by Prentice-Hall, Inc., in 1955, wherein chapter 10 includes a dissertation upon transistor oscillators.

Figure 5:
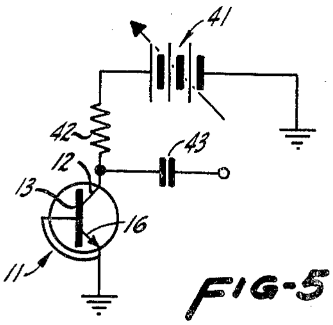
FIG. 5 is a circuit diagram illustrating another application of the transistor of this invention.

Another possible application of the transistor of this invention is illustrated in the switching circuit of FIG. 5. The circuit thereof includes a negative-resistance transistor 11 in accordance with the present invention, wherein the base and emitter are electrically connected internally thereof. A power supply 41 is connected to provide a direct current bias through a resistor 42 to the transistor collector 12. The power supply 41, illustrated only as a simple battery, is grounded, as is the common base-emitter portion of the transistor. External connection is made to the circuit through a capacitor 43 coupled to the transistor collector 12. The current through and the voltage across the transistor may exist in two stable states, i.e., the curves 26 or 27 of FIG. 3. If the value of the load resistor 42 is properly chosen, the transistor operation $V_{BB}$ intersects the current-voltage characteristics, as shown in FIG. 3.

Switching of the transistor from one state to another may be accomplished by momentarily decreasing the battery voltage to $V_{BB'}$ whereby the transistor operates in the high voltage range 26 or by momentarily increasing the battery voltage to $V_{BB''}$ whereby the transistor operates in the low voltage range 27. Like results are attainable by applying voltage pulses to the transistor through the capacitor 43. This circuit is thus suited for logical switching or as a memory device in electronic computation.

Numerous other applications of the present invention will become apparent to those skilled in the electronic arts, for most certainly the highly desirable negative voltage characteristic herein attained has wide applicability and furthermore the extremely wide frequency range within which the transistor of this invention is adapted to operate makes the invention admirably suited for numerous applications hitherto unavailable to transistors.

What is claimed is:

1. A transistor structure comprising a layer of collector material with a layer of base material thereon, an emitter atop said base layer and separated by a very thin portion of said base from said collector, said emitter and base forming a common upper surface mainly comprised by said base, and a pair of ohmic contacts with the first thereof joined to said collector and the second joined to said emitter and base at said common upper surface.

2. An improved double-diffused transistor comprising a collector having a base diffused thereon and an emitter diffused onto said base with the base and emitter having a common surface, and first and second ohmic contacts, the first contact being connected to said collector and the second contact connected to said common surface in engagement with both the emitter and base whereby reverse biasing of the transistor between contacts thereof provides avalanche conduction with rapidly varying inverse resistance characteristics.

3. An improved negative resistance transistor diode structure comprising a wafer of semiconducting material, a thin first layer of opposite type semiconducting material from said wafer material joined to the upper surface of same to form a transistor junction therebetween, a minute second layer of semiconducting material of the same type as said wafer material joined to said first layer to form a transistor junction therebetween, said second layer being separated from said wafer by a very thin portion of said first layer and forming a common surface with said first layer, and a pair of ohmic contacts joined one to the under surface of said wafer and one to said common surface in contact with both first and second layers of said transistor.

4. A negative resistance transistor comprising a wafer of N-type semiconducting material, a layer of P-type semiconducting material adjoining the upper surface of said wafer to form a transistor junction therebetween, a dot of N-type semiconducting material atop the top of said layer to form a transistor junction therewith and separated from said wafer only by a minute thickness of said layer, said dot and layer having a substantially common upper surface, and a pair of ohmic contacts connected one to the underside of said wafer and one to the upper side of said layer in contact with said dot and layer with said contacts being adapted to receive a variable voltage maintaining said wafer at a positive potential relative to said layer and dot thereon.

5. A transistor as claimed in claim 4 further defined by the thickness of said layer between the dot and wafer being of the order of one micron, whereby said transistor has a very high frequency cutoff.

6. An improved avalanche transistor comprising a collector wafer, a first ohmic contact connected to substantially all of one side of said collector wafer, a thin base layer diffused into the other side of said collector wafer to form a transistor junction therebetween, a small emitter diffused into said base layer to form a transistor junction therebetween, and a second ohmic contact connected to substantially all of the exposed base layer and emitter, said contacts being adapted for connection to a variable voltage supply maintaining a reverse bias between said collector and said base for establishing reverse conductions through the transistor whereby same exhibits negative resistance characteristics.

7. An improved double-diffused silicon transistor comprising a collector with a base diffused thereon and an emitter diffused onto said base to form a common base-emitter surface divided by an emitter-base transistor junction, a first ohmic contact bonded to said common surface in electrical contact with both base and emitter, and a second ohmic contact bonded to said collector on the opposite side thereof from said base and extending laterally beyond a projection of said emitter thereon, whereby application of an increasing back-voltage between said contacts produces low current avalanche conduction between base and collector followed at an increased voltage level by a high current avalanche conduction between emitter and collector with the current of the latter increasing at a decreased voltage.

References Cited in the file of this patent

UNITED STATES PATENTS

| | | |
|---|---|---|
| 2,894,862 | Mueller | July 14, 1959 |
| 2,910,634 | Rutz | Oct. 27, 1959 |

Notice of Adverse Decision in Interference

In Interference No. 93,753 involving Patent No. 3,015,048, R. N. Noyce, Negative resistance transistor, final judgment adverse to the patentee was rendered Sept. 28, 1964, as to claims 1, 3 and 4.

[*Official Gazette November 24, 1964.*]